United States Patent
Appich et al.

Patent Number: 5,654,041
Date of Patent: Aug. 5, 1997

[54] METHOD AND DEVICE FOR LACQUERING OR COATING OF A SUBSTRATE BY A CAPILLARY SLOT

[75] Inventors: Karl Appich, Sternenfels; Manfred Stummer, Sinsheim, both of Germany

[73] Assignee: Steag MicroTech GmbH, Pliezhausen, Germany

[21] Appl. No.: 547,779

[22] Filed: Oct. 25, 1995

[51] Int. Cl.⁶ .................... B05D 1/26; B05C 3/18
[52] U.S. Cl. .................... 427/434.5; 427/434.3; 427/443.2; 118/401; 118/429
[58] Field of Search ............... 427/443.2, 434.3, 427/434.5; 118/401, 429

[56] References Cited

U.S. PATENT DOCUMENTS

| | | | |
|---|---|---|---|
| 2,046,596 | 7/1936 | Zwiebel | 91/43 |
| 4,840,821 | 6/1989 | Miyazaki et al. | 427/430.1 |
| 5,203,922 | 4/1993 | Shibata et al. | 118/410 |
| 5,455,062 | 10/1995 | Mühlfriedal et al. | 427/8 |

FOREIGN PATENT DOCUMENTS

| | | |
|---|---|---|
| 0581331 | 2/1994 | European Pat. Off. . |
| 0605080 | 7/1994 | European Pat. Off. . |
| 4121792 | 1/1993 | Germany . |
| 4130432 | 3/1993 | Germany . |
| 9425177 | 11/1994 | WIPO . |
| 94/27737 | 12/1994 | WIPO . |

*Primary Examiner*—Katherine A. Bareford
*Attorney, Agent, or Firm*—Robert W. Becker & Associates

[57] ABSTRACT

A device for coating substrates with a capillary slot includes a component having a capillary slot with an outlet opening. A container filled with a coating fluid is provided. The component is positioned in the container such that the capillary slot communicates with the coating fluid and such that the coating fluid is supplied to the capillary slot. A device for moving vertically the outlet opening of the capillary slot relative to the container is also provided.

20 Claims, 10 Drawing Sheets

METHOD AND DEVICE FOR LACQUERING OR COATING OF A SUBSTRATE BY A CAPILLARY SLOT

BACKGROUND OF THE INVENTION

The invention relates to a method and a device for lacquering or coating of a substrate by means of a capillary channel. When the following text in explaining the invention, to simplify matters, only speaks of lacquering, respectively, of lacquering processes, coating, respectively, coating processes with appropriate fluids, i.e. with appropriate lacquers or appropriate coating fluids, are meant also.

In the field of thin layer technology, especially for the production of LCD monitors, of masks for semi-conductor production, semi-conductor substrates or ceramic substrates etc. often the problem is encountered to provide rectangular or round plates with a uniform layer of lacquer or other initially liquid media, for example, with color filters, photo lacquers, or with special protective layers. In accordance with current engineering practices for lacquering the plates are horizontally attached to a turntable. To the center point of the plate a certain quantity of lacquer is dripped from above by means of a nozzle. Then the turntable is rotated. Due to centrifugal forces the lacquer is distributed on the substrate during rotation ("spin coating"). By this a large portion of the lacquer is spun across the rim of the substrate. The achievable uniformness of the layer thickness depends on the magnitude of the rotation acceleration, the rotation speed, as well as on the viscosity of the lacquer.

Difficulties with respect to the uniformness of the lacquer thickness on rectangular, plate-shaped substrates are encountered with this known process especially in the area of the rims of the substrate. In these areas commonly strips of greater lacquer thickness, i.e., so-called lacquer bulges are observed. This causes a substantial reduction in the uniformness of the lacquer thickness.

In order to collect the lacquer which is spun across the rim of the substrate, such lacquering turntables are commonly mounted within a kind of container, for example, see DE-GM 91 034 94. During the lacquering process spun-off lacquer may splash back onto the surfaces of the substrate. This is disadvantageous for the further processing of the substrate. Moreover, with this known method up to more than 90% of the applied lacquer quantity is spun over the rim of the substrate; this excess lacquer can only be reused at very high expenditure/technical resources. The size of the plates that can be lacquered, respectively coated, has an upper limit. Furthermore, small particles may get ground off and released from the rotating parts of such devices, deposit on the surfaces of the plates, and interfere with the subsequent processes. Moreover, during the spinning operation, lacquer hits the edge of the substrate, and this can lead to problems in the subsequent processes. Furthermore, the entire construction and the drive of such a turntable are complicated and expensive.

An improvement of lacquering and coating processes was achieved by a device for lacquering and coating of plates (PCT/DE 93/00777) with which the lacquering, respectively, coating liquid—in the following called fluid—is applied to the downwardly facing surface of the substrate from below by means of an open channel that is narrowed down to a capillary slot. The substrate is guided across the channel at a constant speed. The channel is formed in such a way that it acts as a capillary tube and thus supplies the lacquer automatically and at a particularly constant speed. The capillary action is achieved by the channel being only, for example, less than 0.5 mm wide. As a result of the capillary action the fluid automatically and at a constant speed rises within the capillary slot, against the force of gravity, and flows out at its outlet opening. Above the slot the lacquer stream contacts the surface that is to be coated in a narrow line and is deposited on this surface as a uniform layer while the substrate is moved relative to the outlet opening.

Thus, the lacquering, respectively, coating process is carried out by combined use of capillary action and adhesive action. With this device the uniformness of the thickness of the lacquer layers, particularly on rectangular substrates, can be improved, and the required lacquer quantity decreases. It can have a disadvantageous effect on the operation of the device that the fluid, in longer intervals between the single lacquering, respectively, coating processes begins to dry or dries out in the area of the outlet opening of the capillary slot. This can have a very disadvantageous effect on the subsequent lacquering, respectively, coating process. Furthermore, it can also be disadvantageous that, due to the adhesive action at the end edge of the substrate that is to be lacquered, respectively, to be coated, an undesired bulge of lacquering or coating material is created.

An object of the present invention is to provide a new device and a new method for lacquering and coating of substrates.

SUMMARY OF THE INVENTION

The device for coating substrates by means of a capillary slot according to the present invention is primarily characterized by:

a component having a capillary slot with an outlet opening;

a container filled with a coating fluid;

the component positioned in the container such that the capillary slot communicates with the coating fluid and such that the coating fluid is supplied to the capillary slot;

means for moving vertically the outlet opening of the capillary slot relative to the container.

Preferably, the outlet opening of the capillary slot is immersible completely into the coating fluid by the means for moving vertically.

Advantageously, the outlet opening of the capillary slot is vertically advanceable to the underside of a substrate to be coated. In the alternative, the underside of a substrate to be coated is vertically advanceable to the outlet opening of the capillary slot.

Expediently, the component is vertically displaceable.

The container is preferably trough-shaped.

The device advantageously further comprises a closure apparatus for closing the container when the device is not in use.

The closure apparatus preferably comprises an upper angular member that is laterally slidable.

The container expediently comprises an overflow for maintaining a constant level of the coating fluid in the container.

The device further comprise a pump and a supply container, wherein the pump replenishes an amount of the coating fluid used for coating a substrate with coating fluid from the supply container to the interior of the container.

The device may also further comprise a filtering device and a pump, wherein the filtering device filters the coating fluid recirculated by the pump. Filtering of the coating fluid is preferably interrupted during a coating step for coating a substrate.

The device further comprises means for suddenly lowering the level of coating fluid in the container. The level of the coating fluid is lowered suddenly at the end of a coating step for coating a substrate.

The device further comprises an element having an adjustable volume, the element arranged in the container within the coating fluid. The element is preferably a bellows. The bellows advantageously comprises a linear drive for adjusting the adjustable volume.

The component comprises expediently two knife-shaped parts forming therebetween the capillary slot in the area of the outlet opening.

Preferably, the container has a top with an opening and wherein the opening has a width selected such with respect to the dimensions of the knife-shape parts that the opening closely surrounds the knife-shaped parts.

The knife-shaped parts in the area of the outlet opening have a horizontal surface having a width within a range of 0.1 to 0.5 mm, preferably substantially 0.2 mm.

In another embodiment of the present invention, the device for coating substrates by means of a capillary slot comprises:

a component having a capillary slot with an outlet opening;

a container filled with a coating fluid;

the component positioned in the container such that the capillary slot communicates with the coating fluid and such that the coating fluid is supplied to the capillary slot;

the component comprising knife-shaped parts between which the capillary slot is formed in the area of the outlet opening.

Preferably, the knife-shaped parts in the area of the outlet opening have a horizontal surface having a width within a range of 0.1 to 0.5 mm, more preferred of substantially 0.2 mm.

The present invention also relates to a method for coating substrates with a coating fluid, the method comprising the steps of:

placing a coating fluid into a container;

supplying the coating fluid from the container to the substrate via a capillary slot;

coating the substrate with the coating fluid;

suddenly lowering the level of the coating fluid within the container toward the end of the coating step in order to end the coating step.

The present invention further relates to yet another method for coating substrates with a coating fluid, the method comprising the steps of:

advancing the outlet opening of the capillary slot close to the bottom side of the substrate such that the coating fluid at the outlet opening contacts the bottom side of the substrate; and enlarging the distance between the outlet opening and the bottom side of the substrate to a value that is sufficient to effect coating.

Preferably, the method further comprises the step of guiding a substrate across the outlet opening of the capillary slot for performing coating. In the alternative, the method further comprises the step of guiding the outlet opening of the capillary slot across the substrate for performing coating.

According to the invention this object is resolved with a device for lacquering or coating of a substrate by means of a component which is provided with a capillary slot, a container that is filled with lacquer or coating liquid—in the following called fluid—within which the component is arranged in such a way that the capillary slot is in contact with the fluid in the container and this fluid can be delivered to the capillary slot, and by means of moving the outlet opening of the capillary slot in the vertical direction relative to the container. The mobility of the outlet opening provides the possibility to guide it particularly close to a substrate and, when the lacquering is completed, to guide it away from the substrate.

It is particularly advantageous to proceed in a way, that the outlet opening of the capillary slot can be completely immersed into the fluid by a vertical movement. By this measure the outlet opening of the capillary channel can, during the intervals of lacquering processes, be completely immersed into the fluid. This prevents possible remains of the fluid, which remain at or on top of the capillary channel, from beginning to dry and particles from depositing thereon from the outside. Either of these can lead to interferences during a later lacquering process.

In a further, extremely advantageous development of the invention a closing mechanism for the container is provided in order to close it up towards the outside when not in use. By this measure any drying process of the entire fluid quantity is prevented for which purpose the closing mechanism is preferably designed to be air-tight.

It has also proven very advantageous to provide a filter device and a pump for filtering the recirculating fluid inside the container. Thus it is possible to filter the fluid by means of a micro particle filter (recirculation filtration), to keep it clean and in a condition that is appropriate for the lacquering purposes. The filtration then is advantageously interrupted during a coating or lacquering process.

Particularly for the prevention of lacquer bulges at the end edge of a lacquered, respectively coated substrate there are advantageously provided means for rapidly lowering the level of the fluid in the container, especially at the end of a lacquering or coating process. By this lowering of the level the fluid is rapidly sucked back into the capillary slot so that the formation of a bulge at a rim of the substrate can be reduced or prevented.

Such a sucking back of the fluid can be achieved particularly advantageously by providing a device which is adjustable in its volume and is positioned in the fluid inside the container. When this volume is reduced, the liquid level in the container is lowered. This creates a low pressure in the capillary slot that sucks back the fluid contained therein.

An inventive method for lacquering or coating of a substrate by means of a fluid comprises the following steps: The fluid is applied to the substrate by means of a capillary slot from a container that holds the fluid; when the lacquering or coating is completed the level of the fluid that is in the container is rapidly lowered in order to interrupt the process of lacquering or coating. Due to the rapid lowering of the fluid level the fluid in the capillary channel is sucked back and by this the lacquering is interrupted without the formation of a bulge at the rim of the substrate.

A further method according to the invention is a method for lacquering or coating a substrate by means of a fluid that is applied through a capillary channel, in the following steps:

a) at the beginning of a coating or lacquering process the outlet opening of the capillary slot is guided upwardly, close to the bottom surface of the substrate so that the fluid contacts this bottom surface at the outlet opening;

b) subsequently, the distance between this outlet opening and the bottom surface of the substrate is enlarged to an appropriate dimension for lacquering or coating.

By this the beginning of a lacquering and the beginning of a fluid transport process within the capillary channel are secured in a simple way.

BRIEF DESCRIPTION OF THE DRAWINGS

Further details and advantageous developments of the invention are presented in the exemplified embodiments that are described in the following and are illustrated in the drawings and in no way are to be understood as a limitation of the invention. It is illustrated in.

DESCRIPTION OF PREFERRED EMBODIMENTS

Figure 1:
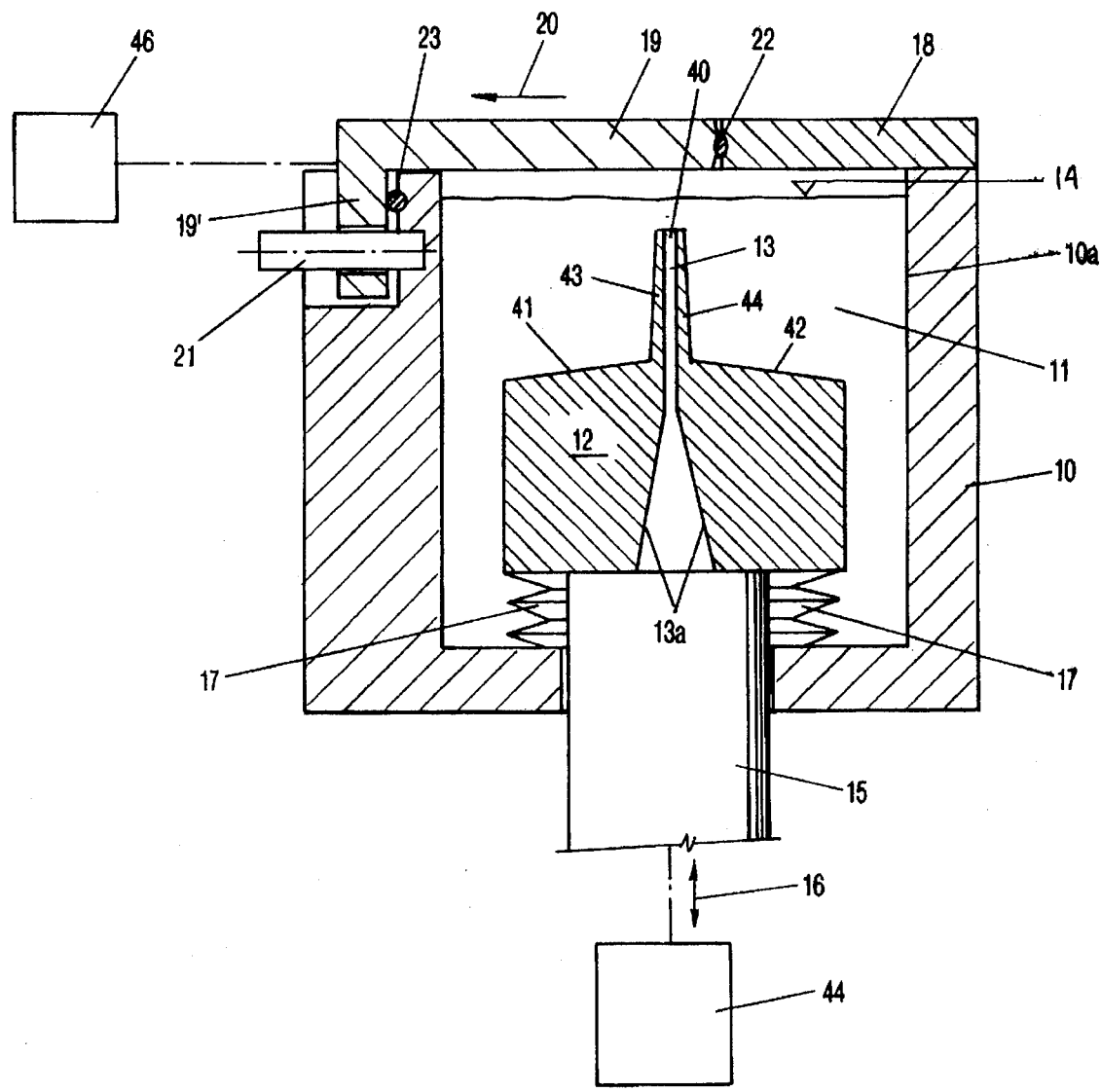
FIG. 1 a cross-section through an inventive device in which the member that forms a capillary slot is positioned in an immersed state.
Figure 2:
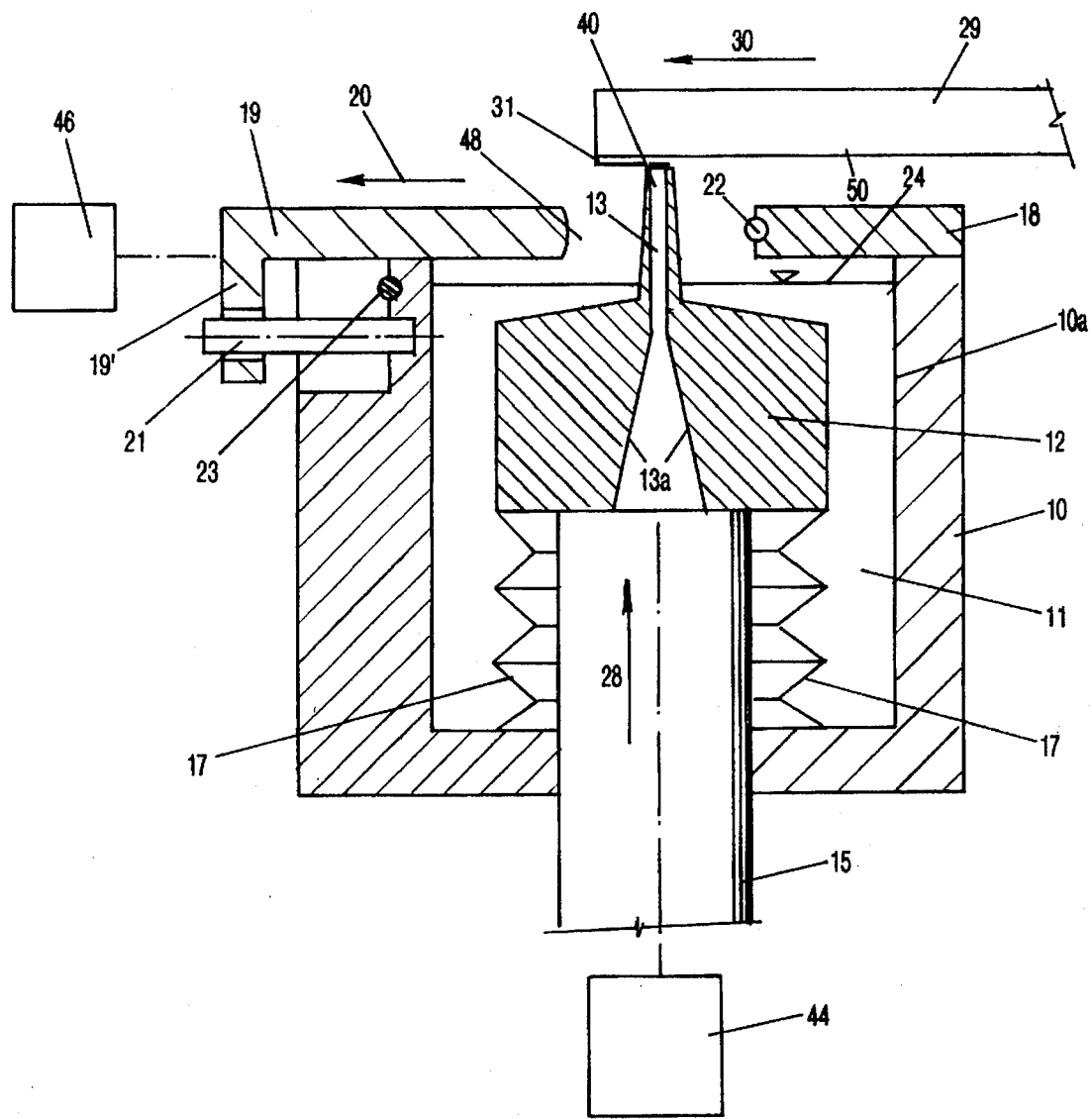
FIG. 2 a cross-section through the device of FIG. 1 in which the component that forms the capillary slot has emerged from the fluid in the container during a lacquering process, viewed along line II—II of FIG. 3.
Figure 3:
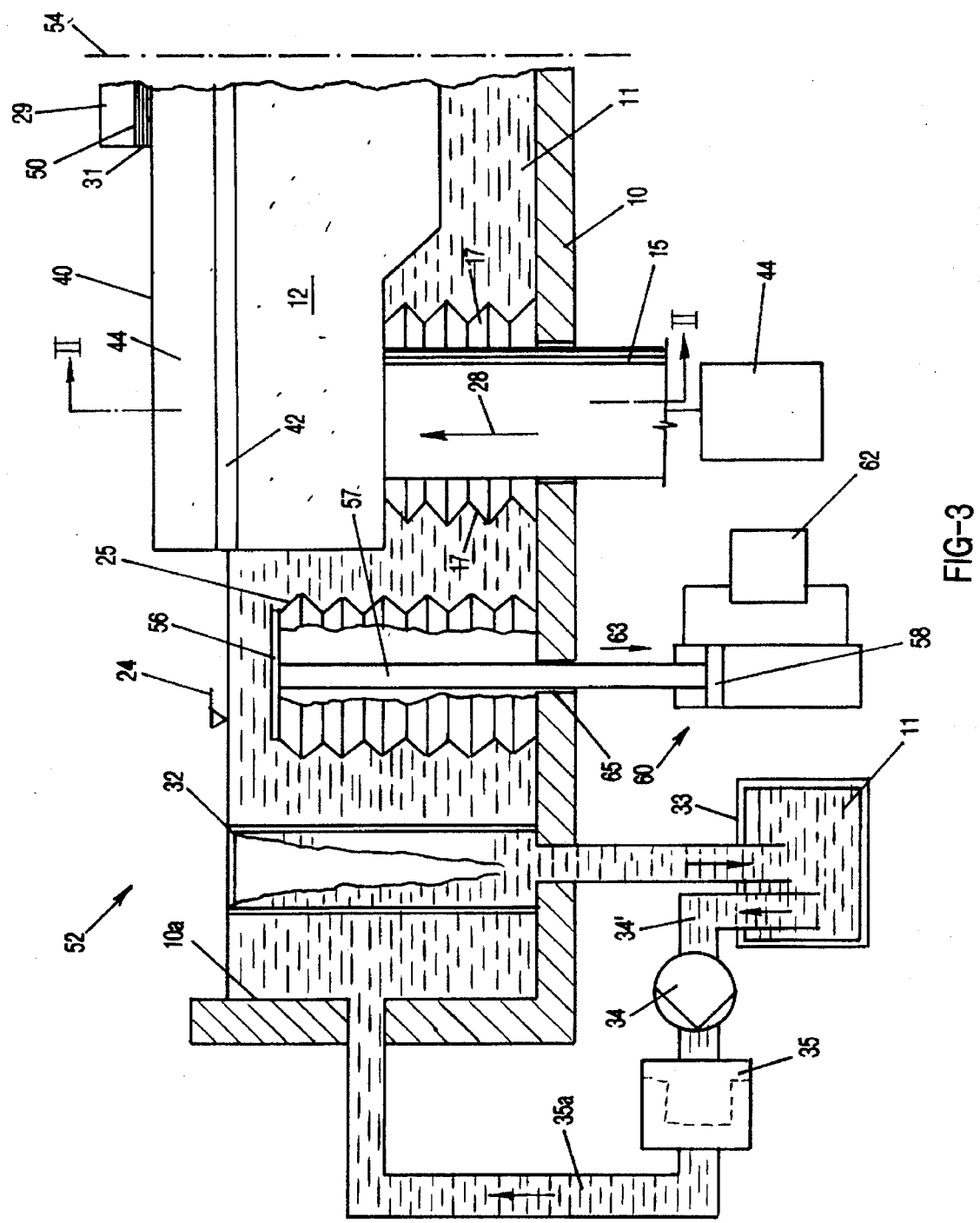
FIG. 3 a longitudinal section through a part of an inventive device with an emerged capillary slot component, during a lacquering process.

First, the basic principle of the present invention is explained with the aid of the schematic illustrations of FIGS. 1 to 3. Then, with the aid of FIGS. 4 to 10, a practical exemplified embodiment of the invention is illustrated which operates in accordance with this basic principle.

FIG. 1 shows a cross section through a container 10, the hollow interior 10a of which is mostly filled with lacquer or coating material 11, in the following called "fluid". Within the container 10 that has the shape of an elongated channel or of an elongated trough, an elongated component 12 is provided which comprises a capillary slot 13 that is necessary for the lacquering process. This slot commonly has a width in the range of 0.1 to 0.8 mm and is formed by a vertically extending gap within the component 12 and enlarges downwardly at 13a in order to allow unhindered flow of the fluid 11 toward the capillary slot 13.

At the upper end of the component 12 the capillary slot 13 has an outlet opening 40 which could also be called a nozzle and which will be explained in detail in the following with the aid of FIG. 7. Depending on the width of a substrate 29 (FIGS. 2 and 3) that is to be coated, this outlet opening 40 can have a length in the range of, for example, 50 to 75 cm, whereby, of course, longer or shorter lengths are not excluded.

The member 12 is basically shaped in cross section as an approximately rectangular base body which is limited, toward the top, by two sloping, rooflike surfaces 41, 42, and in the center of which two knife-like extensions 43, 44 project upwardly, each of which has a width of approximately only 0.1–0.5 mm in the area of the nozzle 40. These extensions 43, 44 are tapered toward the top and are extremely narrow at the top.

The member 12 is, at its bottom surface, connected to a rod 15. This rod 15 is vertically slidable in the direction of arrow 16 by an only schematically illustrated device 44. Through this the member 12 can be moved in the vertical direction. The hollow interior 10a of the container 10 is sealed relative to the rod 15 passing through its bottom by a bellows 17 which in the cross section is illustrated to the right and to the left of the rod 15. For example, a hydraulic or pneumatic working cylinder is appropriate as device 44.

The hollow interior 10a of the container 10 is closed by a fixedly mounted plate 18 on the upper right (FIGS. 1 and 2) and by a slidable angular member 19 on the upper left. The plate 18 is directly mounted on the right sidewall of the container 10. The angular member 19 is laterally slidable in the direction of arrow 20 (FIG. 1) by means of a linear driving means 46 which is illustrated only schematically. For example, the guidance of this sliding movement can, as is illustrated, be effected by a guide bolt 21 which is mounted at the left side wall of the container.

The hollow interior 10a is sealed off by the two elastomeric members 22 and 23. The member 22 is inserted in an appropriate groove in the end face of the plate 18 and is pressed by the end face of the angular member 19 into the groove as is illustrated in FIG. 1. The sealing member 23 is inserted in an appropriate groove in the left sidewall of the container 10 and is pressed by a vertically extended side 19' of the angular member 19 into the groove. The contact pressure is applied by the means 46 which slides the angular member 19. Alternatively, the plate 18 and the angular member 19 can be coated with an appropriate solvent-resistant synthetic of a thickness of e.g. 0.5 mm, which, in the closed position provides the sealing functions.

The member 12 with its capillary slot 13 is illustrated in FIG. 1 as completely immersed below the level 24 of the fluid 11. This corresponds to a state in which no lacquering takes place, i.e., the outlet opening 40 of the member 12 is positioned below the level 24 of the fluid 11.

FIG. 2 illustrates the same cross-section of the container 10 with all components, as illustrated in FIG. 1, but during a lacquering process. The closing apparatus of the hollow interior 10a which comprises the plate 18 and the angular member 19 is open since the angular member 19 is, in comparison to the illustration of FIG. 1, slid to the left in the direction of arrow 20. The member 12 with its capillary slot 13 has been moved upwards in the direction of arrow 28 by a vertical movement of the rod 15. Accordingly, the knife-like (knife-shaped) extensions or parts 43, 44 now projects past the level 24 of the fluid in the container 10 and also through a narrow opening 48 between plate 18 and angular member 19. This corresponds to a state during a lacquering process. By this narrow shape of the knife-like extensions 43, 44 it is achieved that the opening 48 can be very narrow which reduces the risk that contaminants get into the fluid 11 through the opening 48. Furthermore, the vaporization of the fluid 11 is reduced by this measure.

In FIG. 2 a substrate 29 (in the shape of a plate) is illustrated during a lacquering process. This substrate 29 is guided across the outlet opening 40 of the capillary slot 13 at a constant speed in the direction of arrow 30 at a very small distance (e.g. 0.2–0.5 mm). By this a very uniform lacquer layer 31 is deposited at the bottom surface 50 of the substrate 29 through capillary action and adhesion. In the wet state the thickness of the lacquer layer 31 typically ranges from 5 to 50 µm.

In FIG. 3 a longitudinal section through a part of the container 10 and the component 12 during a lacquering process is illustrated. The component 12, as in the illustration of FIG. 2, has been upwardly displaced in the direction of arrow 28. At the bottom surface 50 of the substrate 29 to be lacquered a uniform lacquer layer 31 is deposited. The thickness of this layer 31 is, for illustration purposes, drawn in extreme dimensions.

The partial longitudinal section of FIG. 3 shows a left section 52 of the container 10 and of the member 12 as well as the rod 15 as their vertical drive. Mirror-symmetrical to this, at the other end of the container 10 a corresponding second rod 15 is provided, which is not illustrated in FIG. 3. A plane of symmetry is symbolically illustrated at 54. As has already been explained, the complete length of the component 12 can range, for example, between 50 and 75 cm, whereby the outer rim areas, as illustrated in FIG. 3, are not to be used for the lacquering process. By parallel reciprocating movements of the rod 15 it is secured that the outlet opening (nozzle) 40 of the capillary slot 13 constantly stays in the required, exactly horizontal position.

In FIG. 3, moreover, an overflow pipe 32 is illustrated in section. As soon as the filling level of the fluid 11 in the hollow interior 10a, after turning on a pump 34, reaches the upper rim of this overflow pipe 32 fluid begins to flow out at that rim. Through the overflow pipe 32 it is guided into an expansion tank 33, for example a supply container or bottle which, for example, contains 2.5 l of the fluid 11. The pump 34 is linked with a tube 34' to the container 33 and sucks fluid 11 therefrom. The fluid 11 is returned into the hollow interior 10a through a filtering device in the form of micro filter 35 and a tubing 35a. The pump 34 and the filter 35 are commercially available components and therefore are only schematically illustrated.

The fluid 11 is cleaned by recirculating by pumping between the lacquering, respectively, coating processes, and its filling level 24 inside the container 10 is constantly held at a defined level. Both of these actions are important for the quality of the lacquering, respectively, coating process. During the lacquering, respectively, coating process the fluid 11 is not pumped through the filter 35 since flow inside the container 10 could have a negative impact on the lacquering, respectively, coating result. During the lacquering process of a substrate 29 between 1 and 3 ml of the fluid 11 are commonly used up which causes the fluid surface 24 to drop only very little, e.g. by 0.1 to 0.4 mm, which does not interfere with the lacquering process.

Furthermore, within the hollow interior 10a a bellows 25 is provided. Its upper stop plate 56 is, by a rod 57 that penetrates the bottom of the container 10, linked to a piston 58 of a working cylinder 60 which can be actuated by means of a schematically illustrated device 62.

When the piston 58, by actuating the device 62 (which is commonly actuated by a central control by means of a micro processor which is not illustrated), is pushed downward, the upper stop plate 56 of the bellows 25 moves downward and the volume of the bellows 25 is reduced, whereby air can escape downwardly through an opening 65 in the bottom of the container 10. This causes the fluid level 24 inside the container 10 to drop rapidly. When, reversely, the upper stop plate 56 is moved upwards by means of the working cylinder 60, the fluid level 24 rises to a maximum value which is defined by the overflow pipe 32.

Therefore the fluid level 24 inside the container 10 can, by means of a respective control of the device 62, be changed rapidly according to the requirements.

METHOD OF OPERATION

As soon as a substrate 29 that is to be lacquered is positioned for starting a lacquering process, the cover of the container 10 is opened by sliding the angular member 19 to the left by means of the device 46. Then the knife-like extensions 43, 44 of the member 12 are advanced to a position below the front edge of the substrate 29 that is to be lacquered so as to be spaced at a very small distance of e.g. 0.05 mm. Since the pump 34 is turned off during this step, the fluid level 24 slightly drops, e.g. by 0.1 to 0.5 mm which does not interfer with the coating process. The slight drop of fluid level is a result of the small and thus very advantageous volume of the knife-like extensions 43, 44 which emerge from fluid 11. By the movement of the component 12 contact is made between the small fluid bulge which due to immersion has remained on top of the outlet opening 40 of the capillary channel 13, on the one hand, and with the front bottom edge of the substrate 29, on the other hand. After contact is made, the distance between the outlet opening 40 of the member 12 and the substrate 29 that is to be lacquered, respectively, to be coated, is again enlarged a little, e.g. to 0.2 to 0.5 mm. By this the capillary action is started which transports the fluid 11, against the force of gravity, through the capillary slot 13 at a constant speed. Now, the substrate 29 is set into motion, horizontally in the direction of the arrow 30, at a constant speed. During this operation, a uniform, thin fluid layer 31 is deposited at the bottom surface of the substrate 29 through the capillary channel 13.

When the end edge (which is not illustrated) of the substrate 29 that is to be lacquered is reached, the bellows 25 is rapidly, e.g. within a second, reduced inside in the way that has already been described. Accordingly, the fluid surface 24 within the hollow interior 10a rapidly drops. (During this step the pump 34 then is turned off. In this way a low pressure is created within the capillary slot 13 which sucks the fluid 11 that is inside the capillary slot 13 down. As a result of this the fluid deposition at the bottom surface of the plate 29 is suddenly terminated and an undesired forming of a bulge at the (not illustrated) end edge of the substrate 29 is reliably prevented. By means of the extremely narrow design of the knife-like extensions 43, 44 in the area of the nozzle 40 it is achieved that no lacquer bulges or the like form at the end edge of the substrate 29.

Then the member 12 is again lowered downward into the container 10, and the cover consisting of plate 18 and angular member 19 is again closed in order to seal the interior of the container 10 hermetically towards the outside and to prevent evaporation of the fluid 11 within the hollow interior 10a.

After the cover is closed (by sliding the angular member 19 to the right), the pump 34 is turned on. As a result of this the fluid 11 that has been utilized during the lacquering process is replenished within the hollow interior 10a. As soon as the required filling level of the fluid 11 is reached, the fluid 11 again begins to flow into the expansion tank 33 through the overflow pipe 32. The fluid 11 is being filtered during recirculation. The time period during which the pump 34 operates commonly ranges between only a few seconds. If a contamination of the fluid 11 is detected, the pump can also be operated for a longer time period in order to clean the fluid with the filter 35. The expansion tank 33 has to be replaced from time to time when the fluid inside is spent. A great advantage of the invention is the very economic usage of fluid, e.g. only approximately 1 to 3 ml per plate 29 to be coated. The bottle in which the fluid 11 is delivered by the manufacturer can be used as an expansion tank.

Naturally, many variations and modifications are possible. E.g., the component 12 could also be brought, from the position according to FIG. 2, into its submerged position by a rotation about its longitudinal axis. However, a vertical sliding of the component 12 is presently preferred in order to prevent undesired, unsymmetrical flow processes of the fluid during the lacquering process.

An inventive device can be a part of a larger lacquering apparatus as it is illustrated, e.g. in PCT/DE93/00777. To avoid a lengthy description, reference is expressively made to the contents of the aforementioned PCT-application.

FIGS. 4 to 10 illustrate a preferred embodiment of an inventive device 100. The same parts as the ones in FIGS. 1 to 3 are labeled with the same reference numerals but increased by 100, i.e. 113 is used instead of 13.

Figure 4:
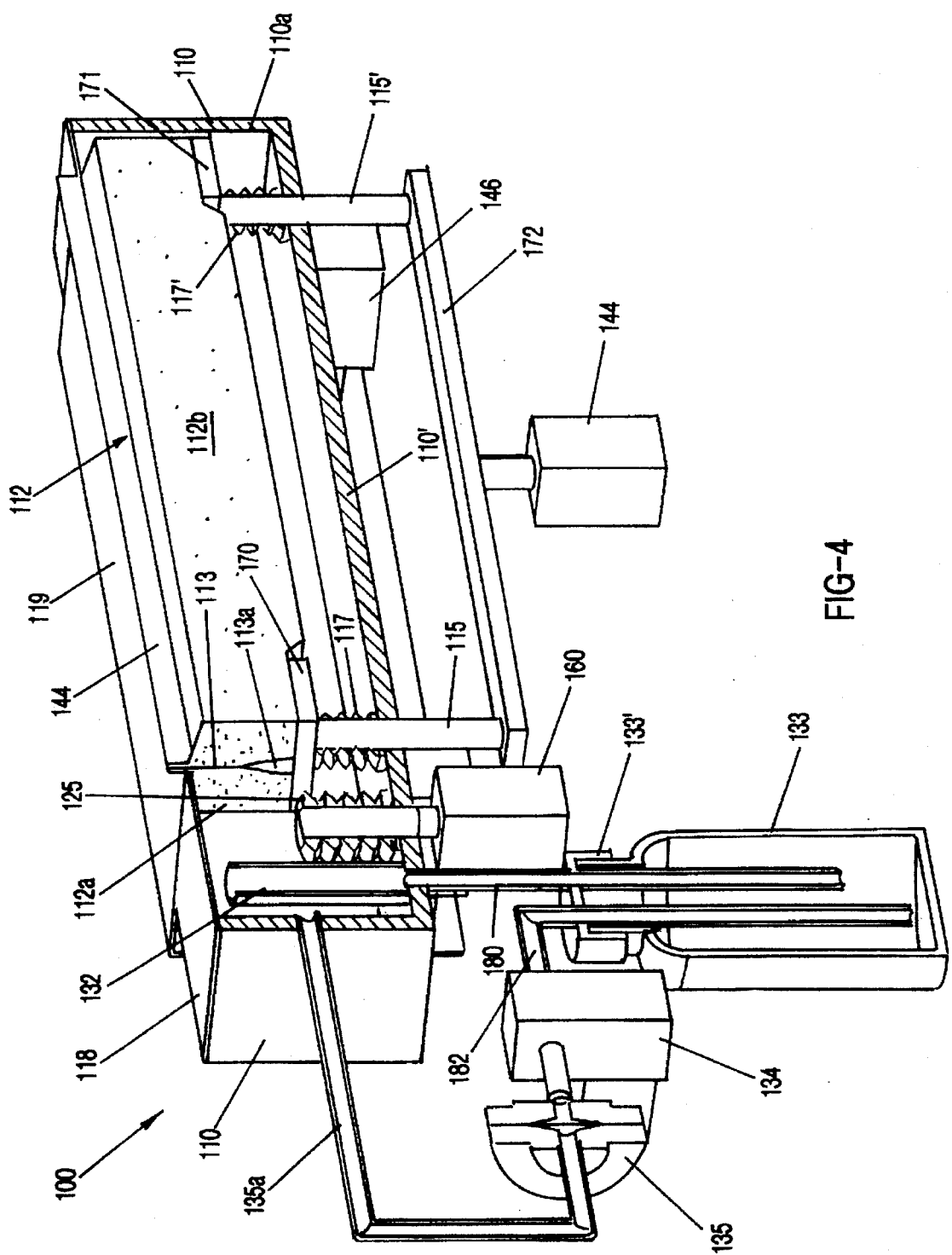
FIG. 4 a perspective view, partly in cross section, of a preferred exemplified embodiment of an inventive device.
Figure 8:
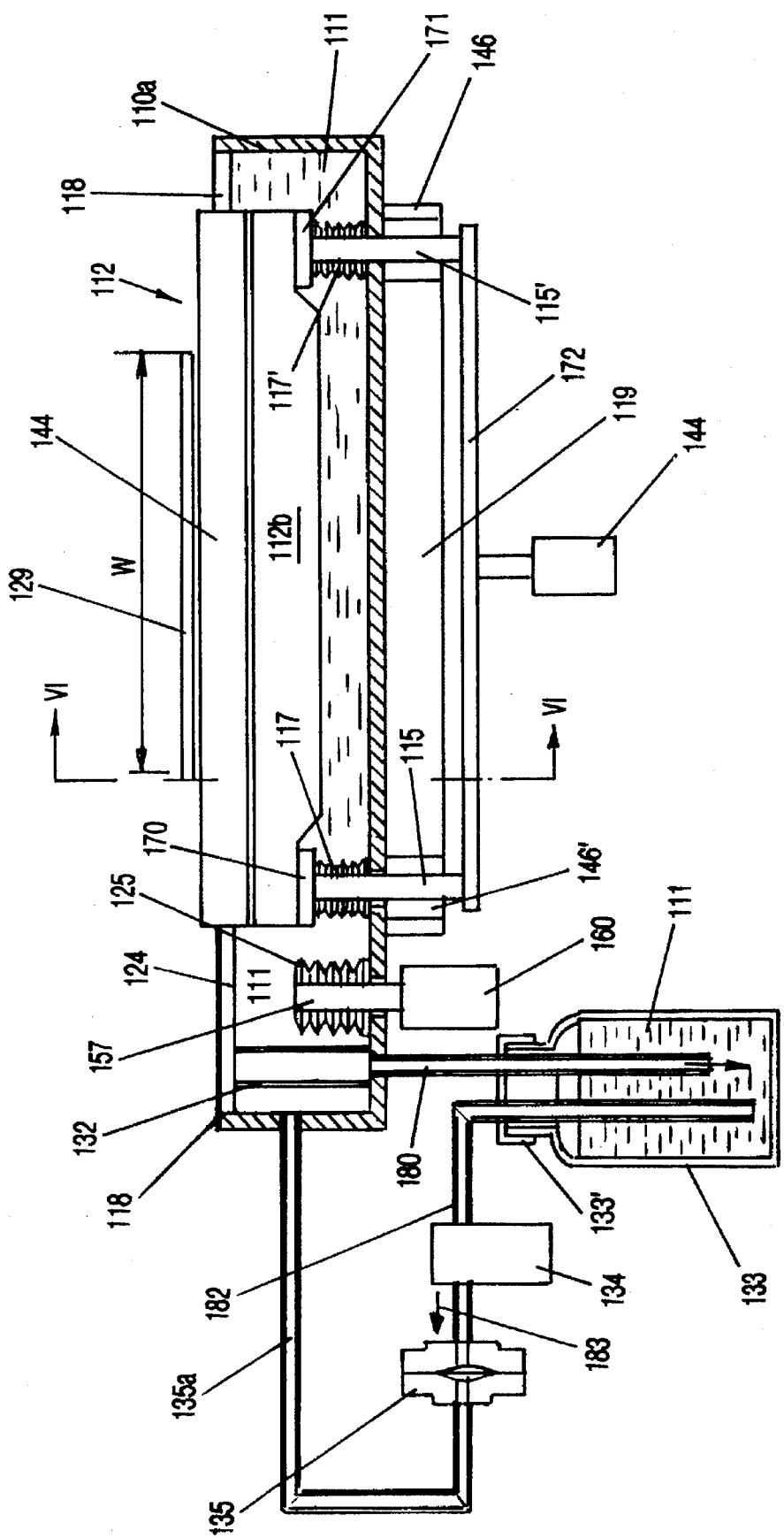
FIG. 8 a longitudinal section through the device, illustrated in FIG. 4.

FIG. 4 illustrates the device 100 in a longitudinal section and in a perspective view. This device has an elongated, trough-like container 110 the bottom of which is labeled as 110'. Its hollow interior 110a is, as illustrated in FIG. 8, filled with a fluid 111 up to the level of an overflow pipe 132. In FIG. 8 the fluid surface is labeled as 124.

Figure 5:
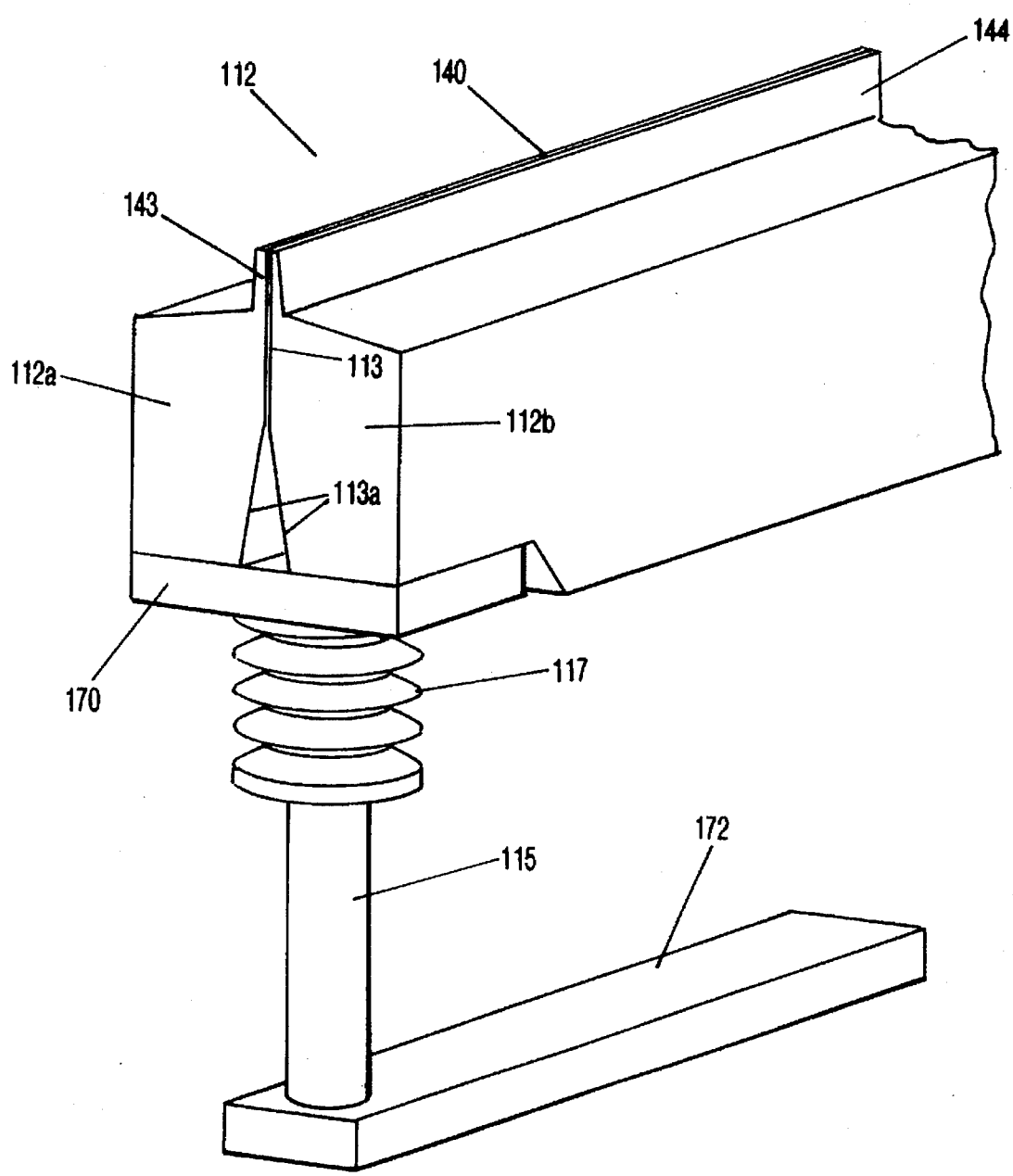
FIG. 5 a detail of FIG. 4, also in perspective view.
Figure 6:
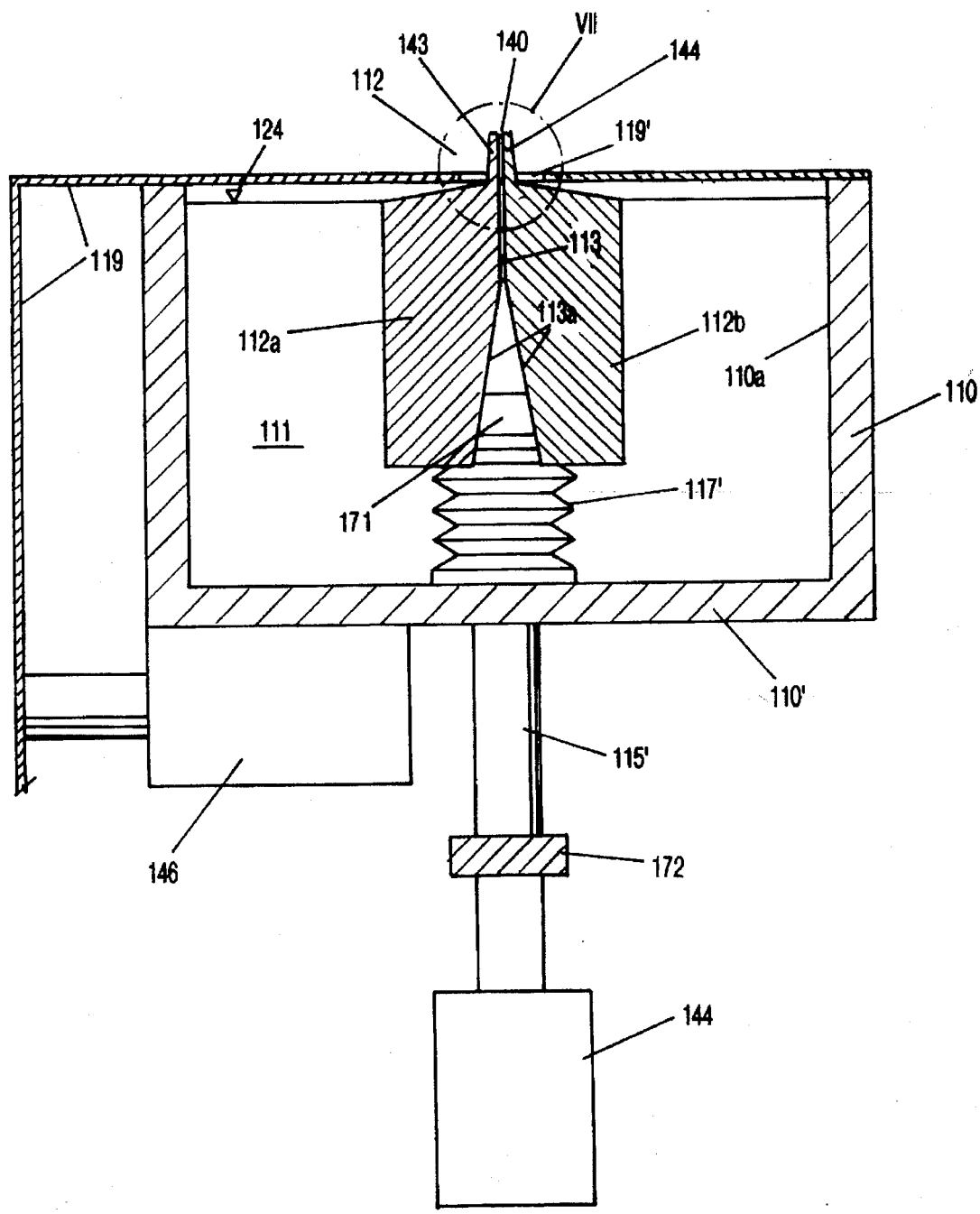
FIG. 6 a cross-section, viewed along line VI—VI of FIG. 8, in an enlarged scale in respect to FIG. 8.

Inside the container an elongated member 112 is provided which, according to FIG. 5, is assembled from two symmetrical halves 112a, 112b which are separated from each other by a capillary slot 113. This capillary slot 113 has a width d1, according to FIG. 7, which depending on the applied fluid 111 ranges between approximately 0.1 to 0.8 mm. The capillary slot 113 widens, in its lower area, into an enlargement 113a which in cross section is funnel-shaped and is illustrated in FIGS. 4, 5, and 6. It facilitates the flow of the fluid 11 into the capillary slot 113.

As is particularly well illustrated in FIGS. 4, 5, 6, and 8, the symmetrical halves 112a, 112b are designed wider in their center area in vertical direction in order to prevent sagging. At its two ends they are less high, and there they are fixedly mounted in an appropriate way, e.g. by (not illustrated) screws on installation plates 170, respectively, 171 which are also fixedly linked to a cylindrical rod 115, respectively, 115'. These rods penetrate the bottom 110' of the container 110 and, at their lower ends, are linked by a cross link 172 which is slidable in a vertical direction by means of a device 144 by which the member 112 can be lifted and lowered as has already been described in connection with FIGS. 1 and 2 for the component 12. The device 144 can be any linear drive, e.g. a pneumatic cylinder or an electrical linear drive.

The rods 115, 115' are sealed by means of bellows 117, 117' in the illustrated way, again, as it has already been explained in detail with the bellows 17 in FIGS. 1 to 3.

As is particularly well illustrated in FIGS. 5 and 6, the halves 112a, 112b of the elongated member 112, at their upper ends are respectively provided with knife-like extensions 143, 144 which basically project vertically upwardly. Each of these extensions 143, 144 at their upper end terminates in a narrow, surface 177, respectively, 178 (FIG. 7) that is horizontal during operation and in which the capillary channel 113 ends as an opening 140. This opening 140 and its surrounding surfaces 177, 178 can also be called a nozzle.

Figure 7:
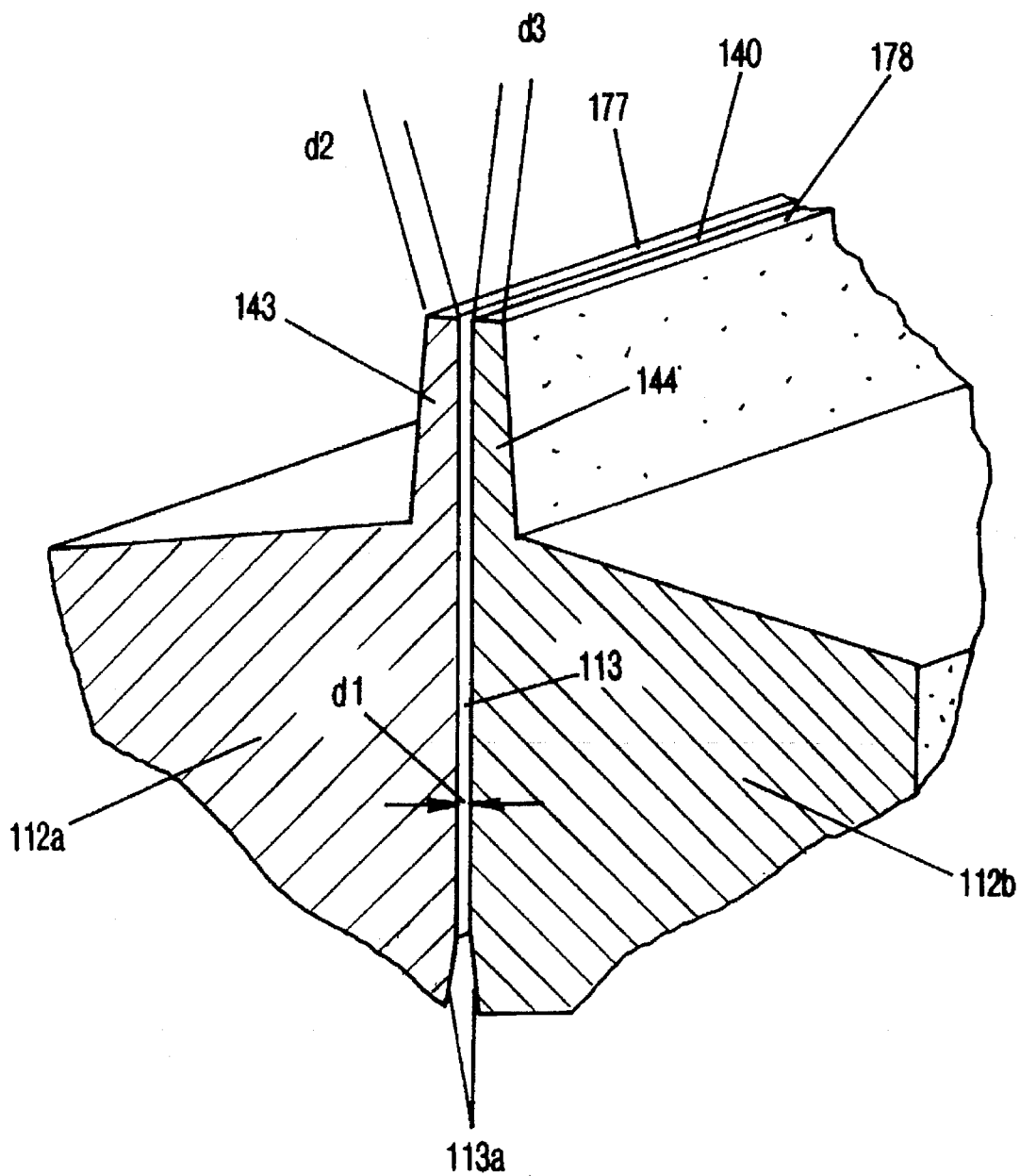
FIG. 7 a perspective view of the detail VII of FIG. 6.

The surface 177 has, according to FIG. 7, a width $d_2$ which ranges between 0.1 and 0.5 mm and preferably is 0.3 mm. The surface 178 has a width $d_3$ (FIG. 7) which ranges between 0.1 and 0.5 mm and preferably is 0.3 mm. The advantage of these narrow surfaces 177, 178 is that due to them the creation of a fluid bulge at the back edge of a substrate 129 that is to be coated can be largely prevented. Such a substrate is illustrated in FIG. 8. Its width W is smaller than the length of the component 12, i.e. for a uniform coating only the central longitudinal portion W of the member 112 is utilized. At the rim areas discontinuities of the fluid layer (31 in FIGS. 1 to 3) may occur.

Figure 9:
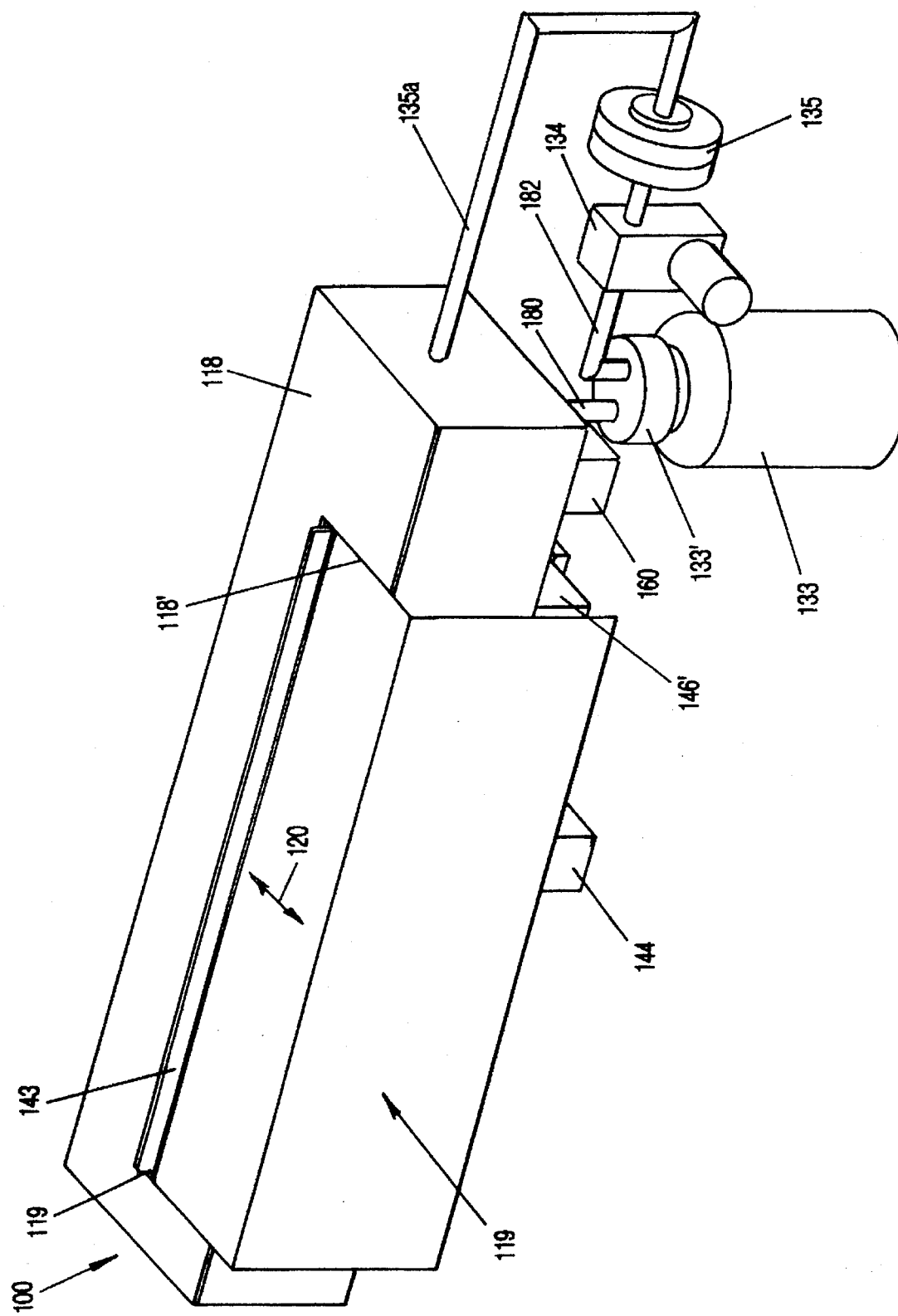
FIG. 9 a perspective view of the device illustrated in FIG. 4, with the capillary slot in operating position, shown from above.
Figure 10:
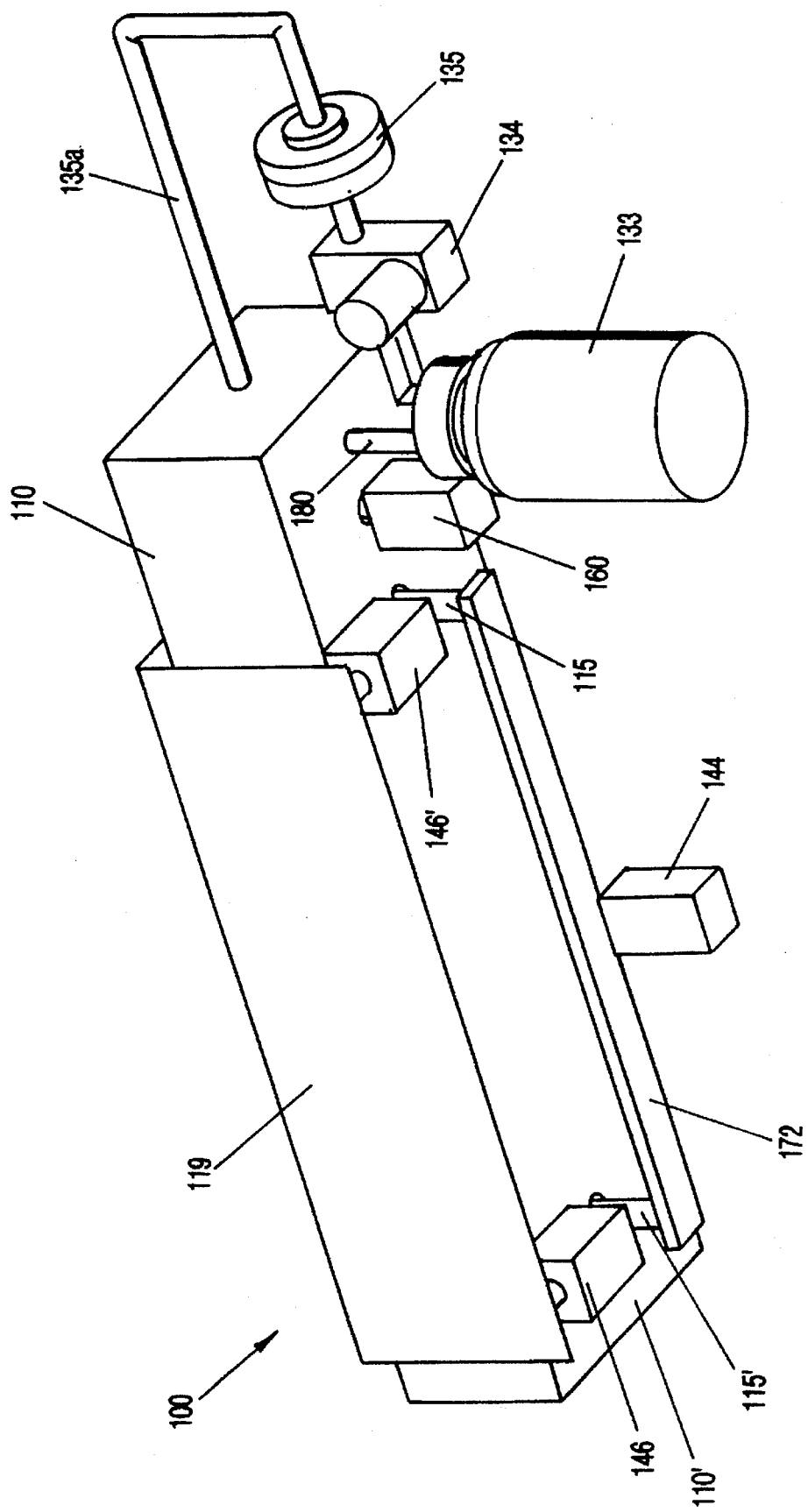
FIG. 10 a perspective view, analogous to FIG. 9, but shown from underneath.

As FIG. 9 illustrates the largest part of the top side of the container 110 is covered by a cover/sealing plate (118). This plate has a rectangular cutout 118' and a slidable angular plate 119 is inserted into it which is horizontally slidable in the direction of arrow 120. When, in FIG. 9, it is slid towards the front, it forms an opening 119' through which the knife-like extensions 143, 144 can be slid upwards for a lacquering process. When the angular plate in FIG. 9 is slid towards the back it closes the opening 119' completely and seals it off. For this purpose both plates 118 and 119 can be coated with a synthetic (not illustrated) which is solvent-resistant that, for example has a thickness of 0.5 mm and which creates the desired sealing at the rims.

For sliding the angular plate 119 horizontally two linear driving devices 146, 146' (FIG. 10) are provided which are operated synchronically in order to achieve a uniform sliding of the angular plate 119.

Inside the hollow interior 110a of the container 110 a bellows 125 is also provided, the volume of which can be changed by means of an actuating means 160. When the volume is changed by moving an actuating rod of the bellows 125 downwards, a rapid lowering of the fluid level 124 inside the container 110 results by which the fluid inside the capillary slot 113 is sucked down and the lacquering process is terminated. When the rod 157 is moved upwards, the fluid level 124 rises rapidly.

To the overflow pipe 132 a pipe 180 is linked which leads down and, through a lid 133', leads into the interior of an extension tank 133 for the fluid 111. A suction tube 182 leads from this bottle 133, again through the lid 133' to a pump 134 which can only be operated when no lacquering process is taking place. This pump 134 transports fluid in the direction of arrow 183 (FIG. 8) to a microfilter 135 and from there through a tubing 135a into the interior 110a of the container 110.

When the angular plate 119 is in its (not illustrated) closed state, in which it hermetically seals off the top of the container 10, the pump 134 can be actuated. It then pumps fluid 111 from the expansion tank 133 through a microfilter 135 into the hollow interior 110a of the container 110 and fills it up to the level of the overflow pipe 132 (FIG. 8). (During a lacquering process the fluid level 124 dips slightly since a small quantity of fluid is used for the lacquering process.)

METHOD OF OPERATION

As soon as a substrate 129 that is to be lacquered is positioned for starting a lacquering process, the cover of the container 110 is opened by sliding the angular plate 119 in opening direction by the two devices 146, 146'. Then the knife-like extensions 143, 144 of the member 112 are advanced to a position below the front edge of the substrate 129 that is to be lacquered at a very short distance of e.g. 0.05 mm by means of a drive 144. Accordingly, contact is made between the small fluid bulge which remained on top of the outlet opening 140 of the capillary channel 113 as a remains of the fluid 111 that is inside the container 110, on the one hand, and with the front bottom edge of the substrate 129 that is to be lacquered, on the other hand. After this contact is made the distance between the outlet opening 140 of the member 112 and the substrate 129 that is to be lacquered, respectively, to be coated again is enlarged a little, e.g. to 0.2 to 0.5 mm. This begins the capillary action which transports the fluid 111 from the container 110, against the force of gravity, through the capillary channel 113 upwards at a constant speed. Now the substrate 129 is horizontally set in motion at a constant speed as is described in detail in FIG. 2. During this operation, a uniform, thin fluid layer is deposited at the bottom surface of the substrate 129 through the capillary channel 113. This layer commonly has a thickness, in the wet state, of between 5 and 50 μm.

When the end edge (which is not illustrated) of the substrate 129 has reached the capillary slot the bellows 125 is rapidly, e.g. within a second, reduced in size in the way that has already been described. Through this the fluid surface 124 within the hollow interior 110a drops rapidly. (During this the pump 134 is turned off.) In this way a low pressure is created within the capillary slot 113 which sucks down the fluid 11 which is inside the capillary slot. As a result of this the fluid deposition at the bottom surface of the plate 129 is suddenly terminated and an undesired forming of a bulge at the (not illustrated) end edge of the substrate 129 is reliably prevented. By means of the extremely narrow design of the knife-like extensions 143, 144 in the area of the opening 140 it is achieved that no lacquer bulges or the like form at the end edge of the substrate 129.

Then the member 112 is again returned into the container 110 where it is completely immersed into the fluid 111 and the opening 119' again is hermetically closed up by the angular plate 119 in order to seal the interior of the container 110 towards the outside and thus prevent evaporation of the fluid 111 within the hollow interior 110a.

After the cover is closed, the pump 134 is turned on, and as a result the fluid 111 that has been utilized during a lacquering process is replenished within the hollow interior 110a. As soon as the correct filling level is reached, the fluid 111 again begins to flow into the supply and expansion tank 133 through the overflow pipe 132. During recirculation the fluid 111 is being filtered by the microfilter 135. For this purpose the pump is commonly turned on for only a few seconds but can also be operated for a longer time period in order to clean the fluid 111. The expansion tank is replaced by a new bottle when the fluid within is used up. For this purpose a new bottle 133 is screwed from the bottom against the fixedly mounted lid. A great advantage of the invention is the very economic usage of fluid 111 and the elimination of the necessity to dispose of fluid remains.

Naturally, within the scope of the invention, many variations and modifications are possible. For example, the closing apparatus of the container 110 can be designed in various ways, e.g. also by placing a lid from above. Also, alternatively, the substrate 129 can be guided towards the opening 140 of the member 112 from above instead of reversely guiding the opening 140 towards the bottom side of the substrate 129.

Also, instead of the bellows 125, a pump could be provided which rapidly sucks fluid 111 from inside the container 110 in order to rapidly lower the fluid surface 124 in which case this pump can very simply be in the form of a hollow interior of a working cylinder. This would be analogous to the process of sucking, before an injection, the liquid that is to be injected, into the syringe. In both cases (pump or cylinder) the fluid can subsequently again be pumped back into the container 110, e.g. by reversing the transporting direction of this pump (not illustrated).

The present invention is, of course, in no way restricted to the specific disclosure of the specification and drawings, but also encompasses any modifications within the scope of the appended claims.

What we claim is:

1. A method for coating an underside of a substrate with a coating fluid, contained in a container and supplied to the underside of the substrate from the container via a capillary slot having an outlet opening by capillary action; said method comprising the steps of:

lifting the outlet opening of the capillary slot from a rest position, in which the outlet opening is submerged in the coating fluid, into a lifted position above the fluid level of the coating fluid;

moving the substrate and the outlet opening relative to one another reducing a distance between the substrate and the outlet opening to a first spacing wetting of the underside of the substrate with the coating fluid present at the outlet opening;

subsequently enlarging the first spacing to a second spacing sufficient for coating the underside of the substrate by capillary action;

moving the substrate across the capillary slot for coating the underside of the substrate.

2. A method according to claim 1, further comprising, after the step of moving the substrate across the capillary slot, the step of instantly lowering the fluid level in the container in order to effect a movement of the coating fluid counter to a direction of flow of the coating fluid caused by capillary action to thereby end coating of the underside of the substrate.

3. A method for coating an underside of a substrate with a coating fluid contained in a container and supplied with a component comprising a capillary slot, the capillary slot having an outlet opening that, in a rest position of the component, is submerged in the coating fluid; said method comprising the steps of:

lifting the outlet opening of the capillary slot from the rest position into a lifted position above the fluid level of the coating fluid;

lowering the underside of the substrate toward the outlet opening to a first spacing in order to effect wetting of the underside of the substrate with the coating fluid present at the outlet opening.

4. A method according to claim 3, further comprising the steps of enlarging the first spacing to a second spacing sufficient for coating of the underside of substrate by capillary action and moving the substrate across the capillary slot for coating the underside of the substrate.

5. A method according to claim 4, further comprising, after the step of moving the substrate across the capillary slot, the step of instantly lowering the fluid level in the container in order to effect a movement of the coating fluid counter to a direction of flow of the coating fluid caused by capillary action to thereby terminate coating of the underside of the substrate.

6. A device for coating an underside of a substrate by a capillary slot; said device comprising:

a component having a capillary slot with an outlet opening;

a container filled with a coating fluid;

said component positioned in said container such that said outlet opening of said capillary slot is submerged in a rest position of said component in said coating fluid;

means for lifting said component from said rest position into a lifted position in which said outlet opening is above a fluid level of said coating fluid for coating the underside of the substrate and for lowering said component from said lifted position into said rest position.

7. A device according to claim 6, wherein said component is vertically lifted and lowered.

8. A device according to claim 6, further comprising a closure apparatus for closing said container when said device is not in use.

9. A device according to claim 8, wherein said closure apparatus comprises an upper angular member connected to an upper side of said closure apparatus so as to be laterally slidable.

10. A device according to claim 6, wherein said container comprises an overflow for maintaining a constant level of the coating fluid in said container.

11. A device according to claim 6, further comprising a pump and a supply container, wherein said pump replenishes an amount of the coating fluid used for coating the substrate with coating fluid from said supply container to the interior of said container.

12. A device according to claim 6 further comprising a filtering device and a pump connected to said container, wherein said pump recirculates the coating fluid from said container through said filtering device for filtering the coating fluid.

13. A device according to claim 12, further comprising a means for automatically interrupting the filtering of the coating fluid during a coating step for coating a substrate.

14. A device according to claim 6, further comprising an element having an adjustable volume, said element arranged in said container within the coating fluid.

15. A device according to claim 14, wherein said element is a bellows.

16. A device according to claim 15, wherein said bellows comprises a linear drive for adjusting the adjustable volume.

17. A device according to claim 6, wherein said component comprises two knife-shaped parts forming therebetween said capillary slot with said outlet opening.

18. A device according to claim 17, wherein said container has a top with an opening and wherein said opening has a width selected such with respect to a size of said knife-shape parts that said opening surrounds said knife-shaped parts at a spacing.

19. A device according to claim 17, wherein said knife-shaped parts at the outlet opening have a horizontal surface having a width within a range of 0.1 to 0.5 mm.

20. A device according to claim 19, wherein said width is substantially 0.3 mm.

* * * * *

UNITED STATES PATENT AND TRADEMARK OFFICE
CERTIFICATE OF CORRECTION

PATENT NO. : 5,654,041
DATED     : August 5, 1997
INVENTOR(S) : Appich et al

It is certified that error appears in the above-indentified patent and that said Letters Patent is hereby corrected as shown below:

On the title page, insert:

[87]  PCT Pub. No.: WO94/25177

PCT Pub. Date: Nov. 10, 1994

[30]      Foreign Application Priority Data

Dec. 22, 1994 [DE]  Germany ......... 44 45 985.8

Mar. 11, 1995 [WO] WIPO.......PCT/EP95/00905--.

Signed and Sealed this

Eighteenth Day of November 1997

Attest:

BRUCE LEHMAN

Attesting Officer    Commissioner of Patents and Trademarks